United States Patent
Sia et al.

(10) Patent No.: US 6,841,847 B2
(45) Date of Patent: Jan. 11, 2005

(54) 3-D SPIRAL STACKED INDUCTOR ON SEMICONDUCTOR MATERIAL

(75) Inventors: Choon-Beng Sia, Singapore (SG); Kiat Seng Yeo, Singapore (SG); Shao-fu Sanford Chu, Singapore (SG); Cheng Yeow Ng, Singapore (SG); Kok Wai Chew, Singapore (SG); Wang Ling Goh, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 22 days.

(21) Appl. No.: 10/131,336

(22) Filed: Sep. 4, 2002

(65) Prior Publication Data

US 2004/0041234 A1 Mar. 4, 2004

(51) Int. Cl.[7] .............................................. H01L 29/00
(52) U.S. Cl. ...................... 257/531; 257/277; 257/508; 257/774; 257/758; 257/778; 257/528; 257/776; 438/706; 438/720; 438/723; 336/12
(58) Field of Search ................................ 257/508, 774, 257/758, 778, 528, 776; 438/706, 720, 723; 336/12

(56) References Cited

U.S. PATENT DOCUMENTS

| | | | | | |
|---|---|---|---|---|---|
| 5,414,402 | A | * | 5/1995 | Mandai et al. | 336/200 |
| 6,355,535 | B2 | * | 3/2002 | Liou | 438/381 |
| 6,395,637 | B1 | * | 5/2002 | Park et al. | 438/706 |
| 6,472,285 | B1 | * | 10/2002 | Liou | 438/319 |
| 2002/0157849 | A1 | * | 10/2002 | Sakata | 174/52.1 |

FOREIGN PATENT DOCUMENTS

| US | 2002/0157849 | * 10/2002 | 174/52.1 |
|---|---|---|---|

* cited by examiner

*Primary Examiner*—Eddie Lee
*Assistant Examiner*—Junghwa Im
(74) *Attorney, Agent, or Firm*—Mikio Ishimaru

(57) ABSTRACT

A 3-D spiral stacked inductor is provided having a substrate with a plurality of turns in a plurality of levels wherein the number of levels increases from an inner turn to the outer turn of the inductor. First and second connecting portions are respectively connected to an inner turn and an outermost turn, and dielectric material contains the first and second connecting portions and the plurality of turns over the substrate.

14 Claims, 2 Drawing Sheets

3-D SPIRAL STACKED INDUCTOR ON SEMICONDUCTOR MATERIAL

TECHNICAL FIELD

The present invention relates generally to integrated circuits and more particularly to on-chip silicon-based inductors.

BACKGROUND OF THE INVENTION

Increasing demands for personal mobile communications equipment have motivated recent research activities to focus on the development of inexpensive, small size, low power consumption, and low noise level systems. To satisfy these requirements, one of the most important and indispensable circuit components is the on-chip silicon-based inductor.

As a result, miniaturization of the inductor on silicon has become a current key research area and extensive work has been done in this area. However, despite efforts by many researchers having skill in the art, achieving high performance on-chip inductors, i.e., high qualify factor (Q), still remains a major problem especially when radio frequency integrated circuits (RFICs) are built on silicon.

Conventional inductors built on silicon are generally planar in nature. The current complementary metal oxide semiconductor (CMOS) process uses a very conductive substrate. Spiral inductors fabricated on such a lossy substrate suffer from high capacitive and magnetic losses.

In addition, high dynamic resistance of metal lines at GHz frequency ranges further degrades the inductor performance in CMOS technology as compared to those fabricated in monolithic microwave integrated circuits (MMICs).

Many fabricating techniques, processes, and materials have been proposed to improve the performance of on-chip inductors. Tedious processing techniques such as etching away the silicon substrate under the inductor have been introduced to remove the substrate parasitic effects completely. Despite achieving good results, industries are reluctant to adopt such a technique because of reliability issues such as packaging yield, as well as long-term mechanical stability.

Another approach to minimize the substrate loss for silicon-based inductors has been to increase the substrate resistivity. This technique has yielded significant results, however, the substrate becomes unsuitable for building active MOS devices.

The most critical factor hindering the performance of silicon-based inductors is the high resistive aluminum-copper (AlCu) interconnects used in silicon processes.

In comparison, thicker and less resistive gold (Au) metalization together with lossless substrate in gallium arsenide (GaAs) technology permits high performance inductors to be fabricated easily. To overcome high metalization resistance, a popular technique is to have the layers of metal stacked together, thereby achieving a high Q inductor.

Another possible alternative is to use an active inductor. In an active inductor high Q factor and inductance can be achieved in a really small silicon area. However, such approach suffers from high power consumption and high noise levels that are not acceptable for low power and high frequency applications. In addition, performance of active inductors are very sensitive and dependent upon the inductor's biasing circuitry, making it time consuming and tedious to design.

As a result of the above, the simplest and most commonly used on-chip inductors are planar silicon-based spiral inductors, which require careful layout optimization techniques to improve performance.

In the conventional spiral inductor design, the inductor is planar and fabricated on a conductive silicon substrate. To improve the Q factor of the spiral inductors, the top metal is usually stacked with a few layers of lower metal through vias to minimize the overall metal series resistance. Nevertheless, when more layers are used to realize a very thick conductor, the whole spiral is brought closer to the substrate. This increases the spiral-to-substrate parasitic capacitance and hence results in a degradation of Q factor as well as the inductor's self-resonant frequency. It has been observed that the Q factor of a 4-layer stacked inductor decreases at a much faster rate compared to 1- to 3-layer stacked inductors. Because of this, it becomes extremely difficult to design high performance inductors with large inductance values since such a phenomenon is more pronounced when the inductors occupy large areas.

Magnetic losses occur when inductors are built on conductive substrates. According to Faraday's law, an image current or eddy current is induced in the substrate underneath the spiral inductor. Since a silicon substrate has low resistivity, this image current can flow easily. In compliance with Lenz's law, the direction of flow for this induced current is opposite to that of the inductor current. This characteristic results in a degradation of the inductor's overall useful inductance.

To reduce these magnetic losses due to the formation of the eddy currents, varying width inductors have been proposed. The basic working principal is to minimize undesirable magnetic flux created by the induced substrate eddy current, density of the inductor's inner turns. Meanwhile, when current density of the inner turns is reduced, induced substrate current at the center of the inductor will also have a lower current density. As a result, at the inductor's core, parasitic magnetic flux generated in the substrate is much weaker and this helps increase the inductance and the Q factor of spiral inductors.

However, it has been observed that the Q factor degrades drastically at higher frequencies when compared with fixed-width spiral inductors. This suggests that for a large inductor to achieve a difference in current density between the inner and outer turns, the overall inductor area must be enormous. Its Q factor is expected to fall even before 2.45 GHz and would, of course, render this technique completely useless.

Solutions to these problems have been long sought, but have long eluded those skilled in the art.

DISCLOSURE OF THE INVENTION

The present invention provides a 3-D spiral inductor having a substrate with a plurality of turns in a plurality of levels wherein the number of levels increases from an inner turn to the outer turns of the inductor. First and second connecting portions are respectively connected to an inner turn and an outermost turn, and a dielectric material contains the first and second connecting portions and the plurality of turns over the substrate. This will reduce current in the inner turn and lower current density in the outer turns to improve inductance and Q factor beyond 2.5 GHz.

The present invention further provides a 3-D spiral stacked inductor where neither additional processing steps nor additional masks are required.

The present invention further provides a 3-D spiral stacked inductor having a greatly reduced average parasitic capacitance as compared to a conventional stacked inductor for the same number of metal layers.

The present invention further provides a 3-D spiral stacked inductor wherein the difference in current density for every turn is much larger compared to the varying width inductor. This difference is achieved without consuming extra silicon. This optimized 3-D stacked design can be implemented for inductors of small as well as large inductance values.

The present invention further provides a circular type as well as copper inductors along with varying widths.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
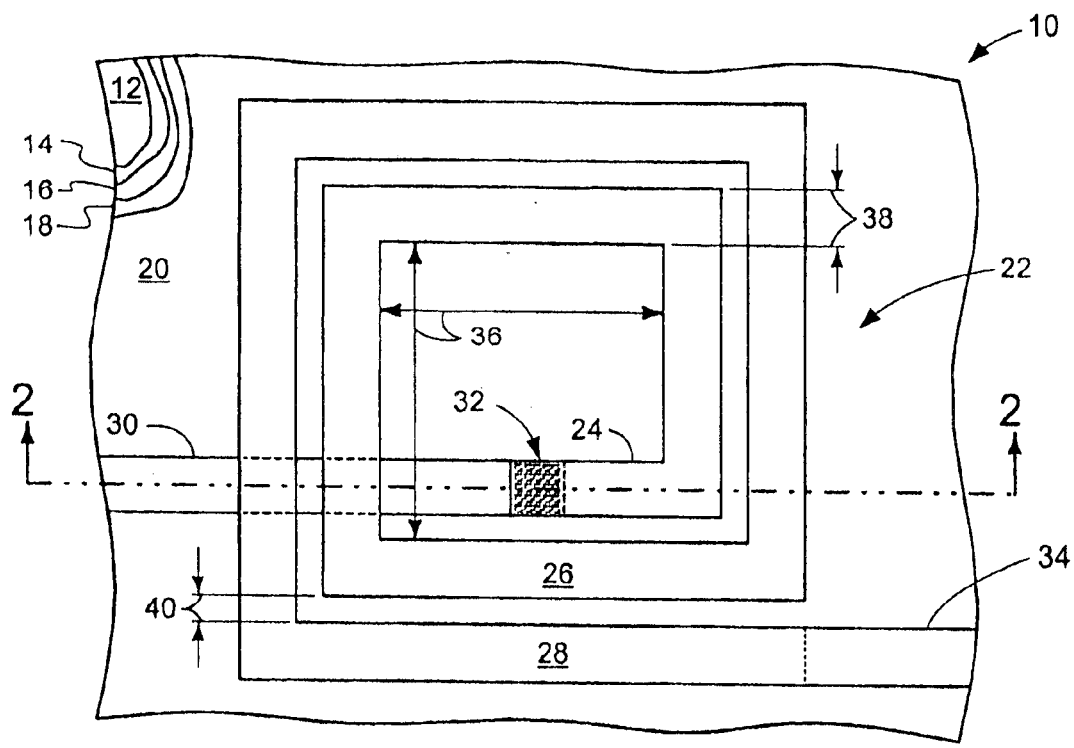
FIG. 1 (PRIOR ART) is a cross-sectional view of a prior art on-chip inductor along line 1—1 of FIG. 2 (PRIOR ART)
Figure 2:
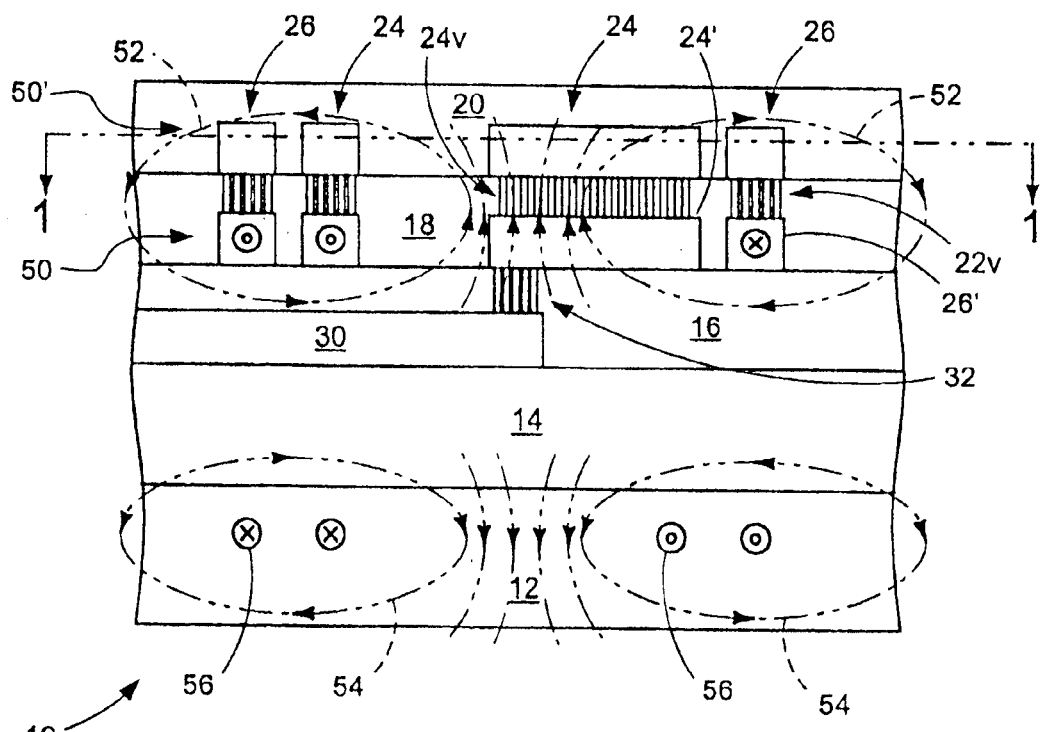
FIG. 2 (PRIOR ART) is a cross-sectional view of the prior art on-chip inductor along line 2—2 of FIG. 1 (PRIOR ART)

Referring now to FIG. 1 (PRIOR ART), therein is shown a cross-sectional view of a prior art on-chip inductor 10 along line 1—1 of FIG. 2 (PRIOR ART). A substrate 12, of a material such as silicon, has a plurality of dielectric layers formed thereon of a material such as silicon dioxide. Sequentially, a field dielectric layer 14 (such as a field oxide), a connecting interlayer dielectric (ILD) layer 16 (such as a silicon oxide), a first level ILD layer 18, and a second level ILD layer 20 are formed over the substrate 12. Embedded within the dielectric layers is a spiral stacked inductor 22.

The term "over" as used in herein is defined vertically above a horizontal plane parallel to the conventional surface of a wafer on which the on-chip inductor is formed regardless of the orientation of the wafer. Terms, such as "on", "below", "higher", "lower", "above", and "under", are defined with respect to the horizontal plane.

The term "processed" or "forming" as used herein to refer to the formation of vias and turns includes conventional semiconductor deposition of photoresist, hard and soft mask photolithography, etch, and strip, as appropriate.

In the prior art, the spiral stacked inductor 22 is a two-turn stacked inductor. In FIG. 1 (PRIOR ART), are shown first and second turns 24 and 26.

A first connecting portion 30 having connecting vias 32 connects to the spiral stacked inductor 22 at one end and a second connecting portion 34 connects at the other end.

The first turn 24 has an inner diameter 36, a width 38 which is common to each of the turns, and a spacing 40 between each of the turns. The first connecting portion 30 passes under the two turns and thus is also referred to as an underpass 30.

Referring now to FIG. 2 (PRIOR ART), therein is shown a cross-sectional view of the prior art on-chip inductor 10 along line 2—2 of FIG. 1 (PRIOR ART). The substrate 12 has the field dielectric layer 14 upon which a conductive material is deposited and patterned to form the underpass 30.

The connecting ILD layer 16 is then deposited over the underpass 30. One or more first via openings are formed in the connecting ILD layer 16 connected to the underpass 30.

A conductive material layer is deposited on the connecting ILD layer 16 and processed to form a first level of the spiral stacked inductor 22. When processed, first and second turns 24' and 26' of a first level 50' will be formed. The first via openings are also filled with conductive material to form connecting vias 32.

The first level ILD layer 18 is then deposited over the first level 50'. One or more second via openings are formed in the first level ILD layer 18 connected to the first and second turns 24' and 26' along their lengths.

A conductive material is deposited on the first level ILD layer 18 and processed to form the first and second turns 24 and 26 of a second level 50'. The first and second turns 24 and 26 are respectively connected to the first and second turn vias 24v and 26v along their lengths by the conductive material filling the respective vias openings to form first and second turn vias 24v and 26v.

The second level ILD layer 20 is then deposited over the second level 50'.

As will be understood by those skilled in the art, as a spiral stacked inductor has more turns, it will still have the same number of turns in each level and the turns will all be connected along their length by pluralities of vias.

During operation, the passage of current (direction indicated by double circles as being an arrow head and the x in a circle being the tail) through the spiral stacked inductor 22 caused the creation of magnetic fields 52 which induce magnetic fields 54 in the substrate 12. According to Faraday's law, an eddy current 56 is induced in the low resistivity substrate 12, which flows in a direction that is opposite to the flow in the spiral stacked inductor 22. This causes a magnetic loss that results in the degradation of the overall useful inductance of the spiral stacked inductor 22.

Figure 3:
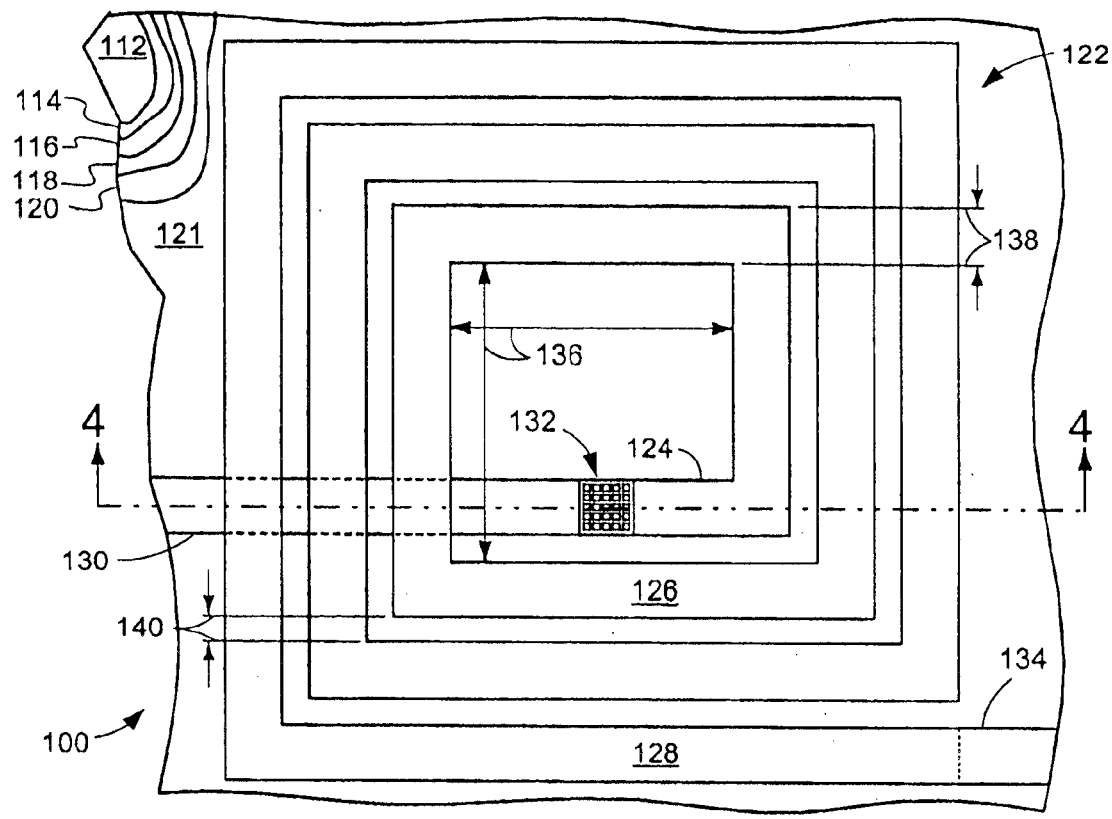
FIG. 3 is shown a cross-sectional view of a 3-D spiral stacked inductor of the present invention along line 3—3 of FIG. 4.
Figure 4:
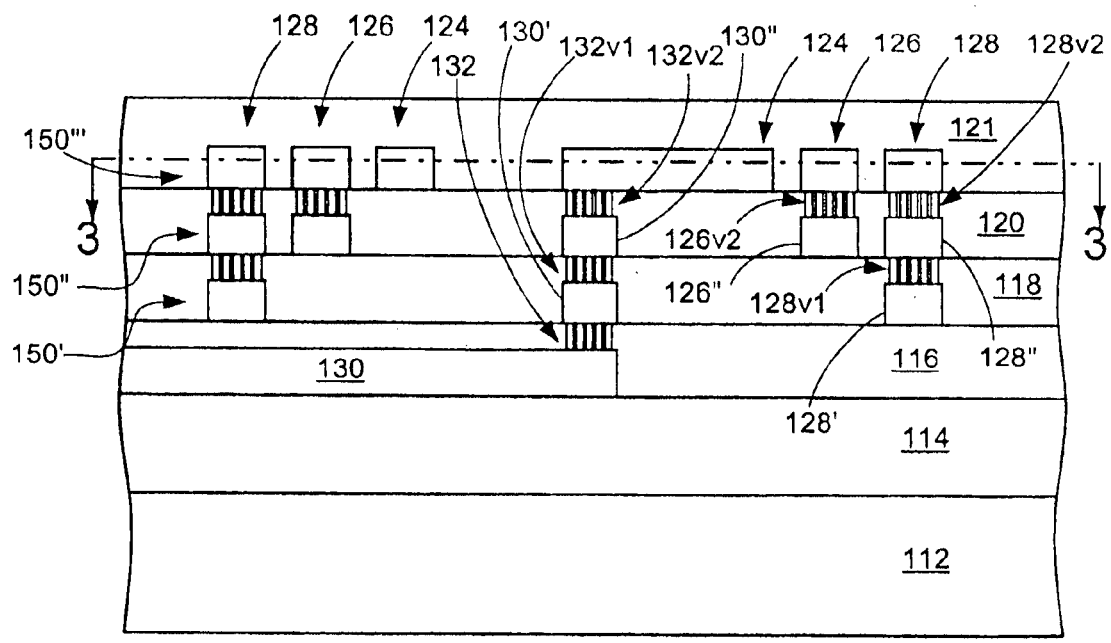
FIG. 4 is shown a cross-sectional view of the 3-D spiral stacked inductor of the present invention along line 4—4 of FIG. 3.

Referring now to FIG. 3, therein is shown a cross-sectional view of a 3-D spiral stacked inductor 100 of the present invention along line 3—3 of FIG. 4. A substrate 112, of a material such as silicon, has a plurality of dielectric layers formed thereon of a material such as silicon dioxide. Sequentially, a field dielectric layer 114 (such as a field oxide), a connecting interlayer dielectric (ILD) layer 116 (such as a silicon oxide), a first level ILD layer 118, a second level ILD layer 120, and a third level ILD layer 121 are formed over the substrate 112. Embedded within the dielectric layers is a 3-D spiral stacked inductor 122.

The 3-D spiral stacked inductor 122 is shown as being square spiral but it may also be circular spiral. Similarly, the 3-D spiral stacked inductor 122 can be a spiral, which is either clockwise or counter clockwise as viewed from above.

In the described embodiment, the 3-D spiral stacked inductor 122 is a 3-D three-turn inductor. In FIG. 3, is shown first, second, and third turns 124, 126 and 128. Individually, the turns can be flat as shown or circular, and can be made from any conductive material including copper.

A first connecting portion 130 having connecting vias 132 connects to the 3-D spiral stacked inductor 122 at one end and a second connecting portion 134 connects at the other end to the third turn 128.

The first turn 126 has an inner diameter 136, a width 138 which is common to each of the turns, and a spacing 140 between each of the turns. The first connecting portion 130 passes under the two turns and thus is also referred to as an underpass 130.

Referring now to FIG. 4, therein is shown a cross-sectional view of the 3-D spiral stacked inductor 100 of the present invention along line 4—4 of FIG. 3. The substrate 112 has the field dielectric 114 upon which a conductive material is deposited and patterned to form the underpass 130.

The connecting ILD layer 116 is then deposited over the underpass 130. One or more first via openings are formed in the connecting ILD layer 116 connected to the under pass 130.

A conductive material layer is deposited on the connecting ILD layer 116 and processed to form a first level of the spiral stacked inductor 122. When processed, a third turn 128' of a first level 150' will be formed and a first connecting contact 130' is formed at the first level 150'. The first via openings are filled with conductive material to form the connecting vias 132.

The first level ILD layer 118 is then deposited over the first level 150'. One or more second via openings are formed in the first level ILD layer 118 connected to the third turn 128' and the first connecting contact 130'. The second via openings extend substantially along the entire length of the third turn 128'.

A conductive material is deposited on the first level ILD layer 118 and processed to form second and third turns 126" and 128" and a second connecting contact 130" of a second level 150". The third turn 128" is connected to third turn 128' along its length by the conductive material filling the second via openings to form first level third turn vias 128v1. The second connecting contact 130" is connected to the first connecting contact 130' by conductive material filling the second via openings to form first connecting vias 132v1.

The second level ILD layer 120 is then deposited over the second level 150". One or more third via openings are formed in the second ILD layer 120 connected to the second and third turns 126" and 128", and the second connecting contact 130". The third via openings extend substantially along the entire length of the second and third turns 126" and 128".

A conductive material is deposited on the second level ILD layer 120 and processed to form first, second, and third turns 124, 126, and 128 of a third level 150'". The first, second, and third turns 124, 126, and 128 are respectively connected to the second connecting contact 130" by conductive material filling the third via openings to form second connecting vias 132v2, and the second level second and third turns 126" and 128" by conductive material filling the third via openings to form second level second and third turn vias 126v2 and 128v2.

The third level ILD layer 121 is then deposited over the third level 150'".

As will be understood by those skilled in the art, as the spiral stacked inductor 22 has more turns, it will still have the same number of turns in each level and the turns will all be connected by pluralities of vias. On the other hand, as the 3-D spiral stacked inductor 122 has more turns, it has more levels with a fewer number of turns per level and, although the turns will all be connected by pluralities of vias, a lower number of turns at the lowest levels. For example, a 3-D two turn inductor has two levels having one turn in a first level and two turns in a second level; a 3-D three turn inductor is shown; a 3-D four turn inductor has four levels with one turn in a first level, two turns in a second level, three turns in a third level, and four turns in a fourth level; etc.

The above means that the induced magnetic fields of the prior art are negligible.

As will be understood by those skilled in the art, since the turns closest to the substrate have the greatest effect on magnetic loss, higher levels may have more or less turns per level without substantially increasing the magnetic loss while the lowest level is optimized by having the underpass and/or a single turn.

Also as will be understood by those skilled in the art, 3-D spiral stacked inductors could be made in the same fashion as shown with various configurations (such as circular), diameters, widths, and spacings. Similarly, different metals can be used for the inductors including aluminum and copper.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. A 3-D spiral stacked inductor comprising:
    a substrate;
    a plurality of turns in a plurality of levels wherein:
        the number of levels increases from an inner turn of the plurality of turns,
        the number of turns decreases in the number of levels more proximate to the substrate to one turn proximate the substrate, and at least one of the plurality of turns is interconnected along the length thereof to another turn in the plurality of levels;

a first connecting portion connected to the inner turn of the plurality of turns in the level distal from the substrate; and a second connecting portion connected to an outermost of the plurality of turns; and a dielectric material containing the first and second connecting portions and the plurality of turns.

2. The 3-D spiral stacked inductor as claimed in claim 1 wherein the one turn is an outermost turn.

3. A 3-D spiral stacked inductor comprising:

a substrate;

a plurality of turns in a plurality of levels wherein:
   the number of levels increases from an inner turn of the plurality of turns,
   a turn of the plurality of turns proximate to the substrate has one turn and the largest number of levels having other turns of the plurality of turns connected thereto,
   the most distal level from the substrate has the most turns of the plurality of turns, and
   the number of turns increases distally from the substrate;

a first connecting portion connected to an inner turn of the plurality of turns;

a second connecting portion connected an outermost turn of the plurality of turns; and a dielectric material containing the first and second connecting portions and the plurality of turns.

4. The 3-D spiral stacked inductor as claimed in claim 3 wherein the inner turn is in the distal level of the plurality of levels.

5. A 3-D spiral stacked inductor comprising: a substrate;

a first level first turn over the substrate;

a first dielectric layer over the substrate and the first level first turn, the first dielectric layer having provided therein a first turn first via opening connected to the first level first turn;

a second level second turn over the first dielectric layer and not over a first level turn;

a second level first turn over the first dielectric layer and in the first turn first via opening connected to the first level first turn; and a second dielectric layer over the first dielectric layer, the second level second turn, and the second level first turn.

6. The 3-D spiral stacked inductor as claimed in claim 5 wherein:

the second dielectric layer has provided therein a first turn second via opening and a second turn second via opening respectively connected to the second level first turn and second level second turn;

and including:

a third level turn over the second dielectric layer and not over a second level turn;

a third level second turn over the second dielectric layer end in the second turn second via opening connected to the second level second turn;

a third level first turn over the second dielectric layer and in the first turn second via opening connected to the second level first turn; and a third dielectric layer over the second dielectric layer, the third level third turn, the third level second turn, and the third level first turn.

7. The 3-D spiral stacked inductor as claimed in claim 6 wherein:

the third dielectric layer has provided therein a first turn third via opening, a second turn third via opening, and a third turn third via opening respectively connected to the third level first turn, the third level second turn, and the third level third turn;

and including:

a fourth level fourth turn over the third dielectric layer and not over a third level turn;

a fourth level third turn over the third dielectric layer and in third turn third via opening connected to the third level third turn;

a fourth level second turn over the third dielectric layer and in the second turn third via opening connected to the third level second turn;

a fourth level first turn over the third dielectric layer and in the first turn third via opening connected to the third level first turn; and a fourth dielectric layer over the third dielectric layer, the fourth level fourth turn, the fourth level third turn, the fourth level second turn, and the fourth level first turn.

8. The 3-D spiral stacked inductor as claimed in claim 7 including:

a first connecting portion under the first level first turn and connected to a turn selected from the group consisting of the second level second turn, the third level third turn, the fourth level fourth turn, and a combination thereof.

9. The 3-D spiral stacked inductor as claimed in claim 7 including:

a second connecting portion connected to a turn selected from the group consisting of the second level first turn, the third level first turn, the fourth level first turn, and combination thereof.

10. A 3-D spiral stacked inductor comprising:

a substrate;

a field dielectric over the substrate;

a first connecting portion over the field dielectric;

a connecting dielectric layer over the first connecting portion and having provided therein a connecting via opening connected to the first connecting portion;

a first level first turn over the connecting dielectric layer;

a first level connecting contact over the connecting dielectric layer and in the connecting via opening connected to the first connecting portion;

a first dielectric layer over the connecting dielectric layer, the first level first turn, and the first level connecting contact, the first dielectric layer having provided therein a first turn first via opening connected to the first level first turn and a first connecting via opening connected to the first level connecting contact;

a second level second turn over the first dielectric layer and not over a first level turn;

a second level first turn over the first dielectric layer and in the first turn first via opening connected to the fist level first turn and in the first connecting via opening; and a second dielectric layer over the first dielectric layer, the second level second turn, and the second level first turn.

11. The 3-D spiral stacked inductor as claimed in claim 10 including:
- a second level connecting contact over the first dielectric layer;

and wherein:
the second dielectric layer having provided therein a first turn second via opening, a second turn second via opening, and a second connecting via opening respectively connected to the second level first turn, second level second turn, and the second level connecting contact;

and including:
- a third level third turn over the second dielectric layer and not over a second level turn;
- a third level second turn over the second dielectric layer and in the second turn second via opening connected to the second level second turn;
- a third level first turn over the second dielectric layer and in the first turn second via opening connected to the second level first turn; and
- a third layer over the second dielectric layer, the third level third turn, the third level second turn, and the third level first turn.

12. The 3-D spiral stacked inductor as claimed in claim 11 including:
- a third level connecting contact over the second dielectric layer;

and wherein:
the third dielectric layer has provided therein a first turn third via opening, a second turn third via opening, a third turn third via opening, and a third connecting via opening respectively connected to the third level first turn, the third level second turn, the third level third turn, and the third level connecting contact;

and including:
- a fourth level fourth turn over the third dielectric layer and not a third level turn;
- a fourth level third turn over the third dielectric layer and in the first turn third via opening connected to the third level third turn;
- a fourth level second turn over the third dielectric layer and in th second turn third via opening connected to the third level second turn;
- a fourth level first turn over the third dielectric layer and in the third turn third via opening connected to the third level first turn;
- a fourth dielectric layer over the third dielectric layer, the fourth level fourth turn, the fourth level third turn, the fourth level second turn, and the fourth level first turn.

13. The 3-D spiral stacked inductor as claimed in claim 12 including:
- a first connecting portion under the first level first turn and connected through a connecting contact selected from a group consisting of the first level connecting contact, the second level connecting contact, the third level connecting contact, and a combination thereof to a turn selected from a group consisting of the second level second turn, the third level third turn, the fourth level fourth turn, and a combination thereof.

14. The 3-D spiral stacked inductor as claimed in claim 12 including:
- a second connecting portion connected to a turn selected from the group consisting of the second level first turn, the third level first turn, the fourth level first turn, and a combination thereof.

* * * * *